United States Patent
Tatsumi et al.

(10) Patent No.: US 9,866,151 B2
(45) Date of Patent: Jan. 9, 2018

(54) ELECTROSTATIC CHUCK, GLASS SUBSTRATE PROCESSING METHOD, AND SAID GLASS SUBSTRATE

(71) Applicant: CREATIVE TECHNOLOGY CORPORATION, Tokyo (JP)

(72) Inventors: Yoshiaki Tatsumi, Kawasaki (JP); Toshifumi Sugawara, Kawasaki (JP)

(73) Assignee: CREATIVE TECHNOLOGY CORPORATION, Kawasaki-shi, Kawasaki (JP)

( * ) Notice: Subject to any disclaimer, the term of this patent is extended or adjusted under 35 U.S.C. 154(b) by 437 days.

(21) Appl. No.: 14/441,937

(22) PCT Filed: Oct. 21, 2013

(86) PCT No.: PCT/JP2013/078422
§ 371 (c)(1),
(2) Date: May 11, 2015

(87) PCT Pub. No.: WO2014/083965
PCT Pub. Date: Jun. 5, 2014

(65) Prior Publication Data
US 2015/0288302 A1    Oct. 8, 2015

(30) Foreign Application Priority Data
Nov. 27, 2012 (JP) .................................. 2012-259016

(51) Int. Cl.
*H02N 13/00* (2006.01)
*H01L 21/683* (2006.01)
(Continued)

(52) U.S. Cl.
CPC ............ *H02N 13/00* (2013.01); *B65G 49/061* (2013.01); *C03C 17/002* (2013.01); *C23C 14/50* (2013.01);
(Continued)

(58) Field of Classification Search
CPC ............. H01L 21/6831–21/6833; H02N 13/00
See application file for complete search history.

(56) References Cited

U.S. PATENT DOCUMENTS 5,527,584 A * 6/1996 Darfler .................. B29C 70/083
428/116
5,667,622 A * 9/1997 Hasegawa ......... H01L 21/67069
156/345.27
(Continued)

FOREIGN PATENT DOCUMENTS

CN      101180721 A     5/2008
CN      202120988 U     1/2012
(Continued)

OTHER PUBLICATIONS

Translation of JP 2002009064. Jan. 11, 2002.*
(Continued)

*Primary Examiner* — Stephen W Jackson
*Assistant Examiner* — Christopher Clark
(74) *Attorney, Agent, or Firm* — Westerman, Hattori, Daniels & Adrian, LLP

(57) ABSTRACT

An electrostatic chuck that enables high speed and high quality processing of a plate to be processed, and in which the weight of a base member is reduced and the strength thereof increased so as to maintain the flatness of the base member and prevent the plate to be processed from falling; a glass substrate processing method; and said glass substrate. An electrostatic chuck (1) provided with a base member (2) and an electrostatic suction layer (3). The base member (2) is formed by a lower-surface plate (20), side-surface plates (21-24), and an upper-surface plate (25), and has a part (4) for a plurality of individual structures configured therein. The part (4) for a plurality of individual structures has a honeycomb structure that is caused by (Continued)

regular hexagonal tubes (40) and enables the weight of the base member (2) to be reduced and the strength thereof increased.

14 Claims, 10 Drawing Sheets

(51) Int. Cl.
B65G 49/06 (2006.01)
C23C 14/50 (2006.01)
C03C 17/00 (2006.01)
(52) U.S. Cl.
CPC ..... *H01L 21/6831* (2013.01); *Y10T 29/49998* (2015.01)

(56) References Cited

U.S. PATENT DOCUMENTS

| | | | | |
|---|---|---|---|---|
| 5,883,778 | A * | 3/1999 | Sherstinsky | C23C 16/4586 279/128 |
| 6,048,434 | A * | 4/2000 | Tamura | H01L 21/67109 118/500 |
| 6,359,264 | B1 * | 3/2002 | Schaper | H01L 21/67126 118/724 |
| 8,226,769 | B2 * | 7/2012 | Matyushkin | H01L 21/67109 118/725 |
| 8,329,586 | B2 * | 12/2012 | Buchberger, Jr. | H01L 21/67069 438/689 |
| 2001/0053508 | A1 | 12/2001 | Shirakawa et al. | |
| 2001/0054389 | A1 * | 12/2001 | Sago | C23C 16/4586 118/728 |
| 2003/0102016 | A1 * | 6/2003 | Bouchard | H01L 21/67028 134/32 |
| 2003/0127605 | A1 | 7/2003 | Kondo | |
| 2004/0079518 | A1 * | 4/2004 | del Puerto | G03F 7/70716 165/58 |
| 2004/0115947 | A1 * | 6/2004 | Fink | H01L 21/67103 438/716 |
| 2004/0187791 | A1 * | 9/2004 | Busse | H01L 21/6831 118/728 |
| 2005/0178335 | A1 | 8/2005 | Strang et al. | |
| 2005/0219786 | A1 * | 10/2005 | Brown | H01L 21/6831 361/234 |
| 2007/0201180 | A1 * | 8/2007 | Nakash | H01L 21/6833 361/234 |
| 2007/0258186 | A1 * | 11/2007 | Matyushkin | H01L 21/67109 361/234 |
| 2014/0072774 | A1 * | 3/2014 | Kito | H01L 21/67092 428/174 |
| 2014/0202386 | A1 * | 7/2014 | Taga | C23C 4/08 118/723 R |
| 2014/0242780 | A1 * | 8/2014 | Gauldin | H01L 21/3065 438/463 |
| 2015/0129165 | A1 * | 5/2015 | Parkhe | H01L 21/6833 165/67 |

FOREIGN PATENT DOCUMENTS

| | | |
|---|---|---|
| JP | 2002-9064 A | 1/2002 |
| JP | 2002-83859 A | 3/2002 |
| JP | 2003-249542 A | 9/2003 |
| JP | 2004-512677 A | 4/2004 |
| JP | 2004-282011 A | 10/2004 |
| JP | 2005-203537 A | 7/2005 |
| JP | 2006-3611 A | 1/2006 |
| JP | 2006-100852 A | 4/2006 |
| JP | 2009-272515 A | 11/2009 |
| JP | 2010-132978 A | 6/2010 |
| JP | 2011-94196 A | 5/2011 |
| JP | 2012-92448 A | 5/2012 |
| TW | 200303063 A | 8/2003 |
| TW | 200420735 A | 10/2004 |

OTHER PUBLICATIONS

Office Action dated Oct. 10, 2016, issued in counterpart Chinese Patent Application No. 201380059698.8, with English translation. (15 pages).
Office Action dated Nov. 10, 2016, issued in counterpart Taiwanese Application No. 102142789. (8 pages).
Office Action dated Feb. 1, 2017. issued in counterpart Japanese Application No. 2014-550086, with English translation (4 pages).
Office Action dated Nov. 22, 2016, issued in counterpart Japanese Application No. 2014-550086. (4 pages).
International Search Report dated Dec. 3, 2013, issued in corresponding application No. PCT/JP2013/078422.

* cited by examiner

[FIG. 1]
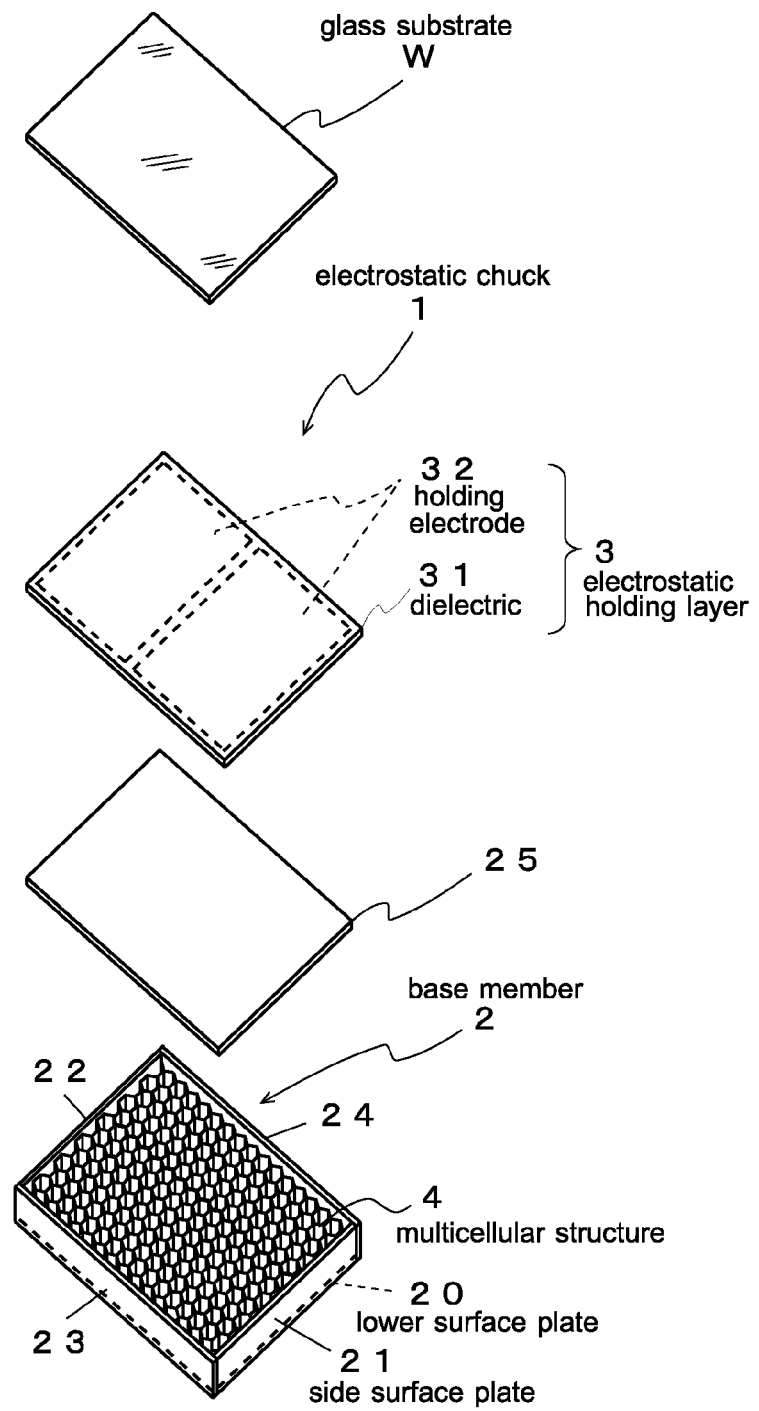

[FIG. 2]
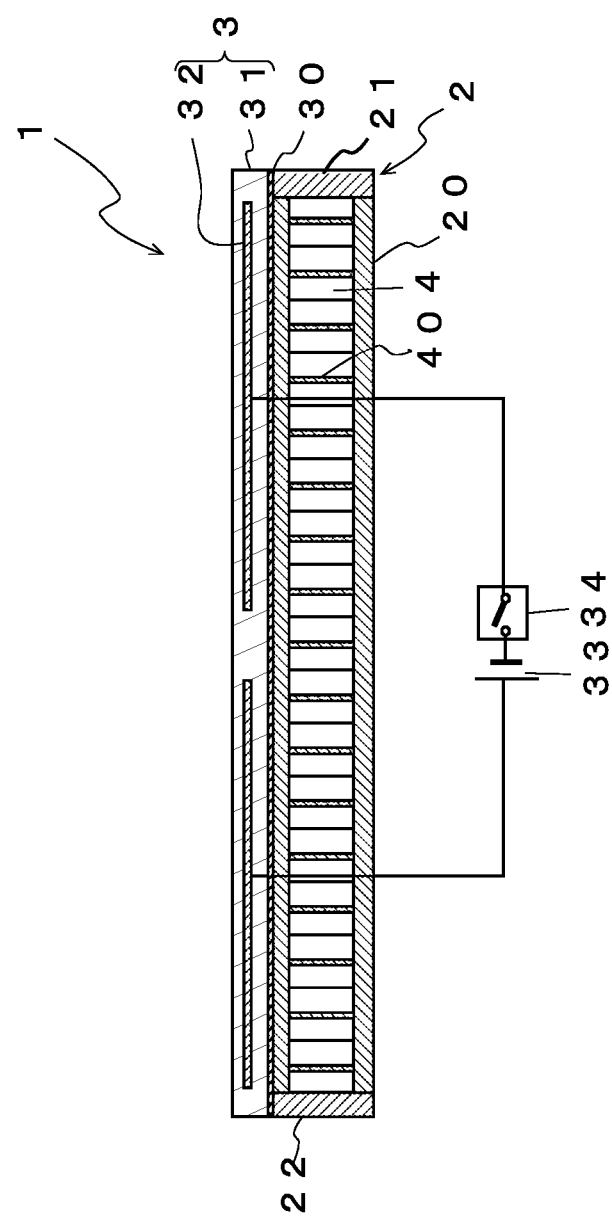

[FIG. 3]
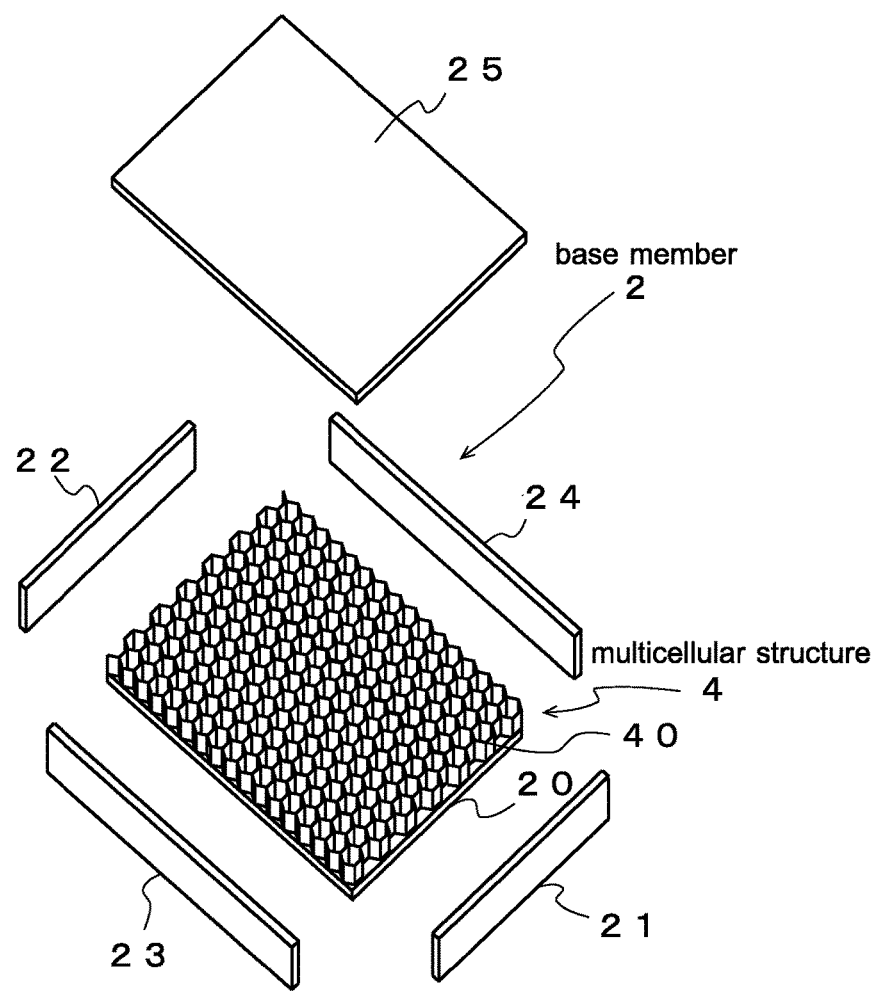

[FIG. 4]
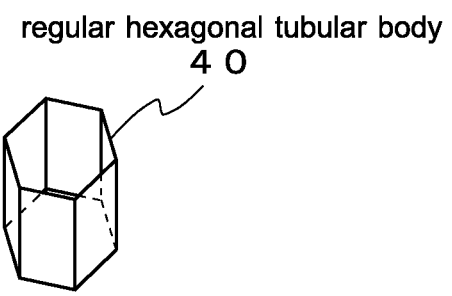

[FIG. 5]
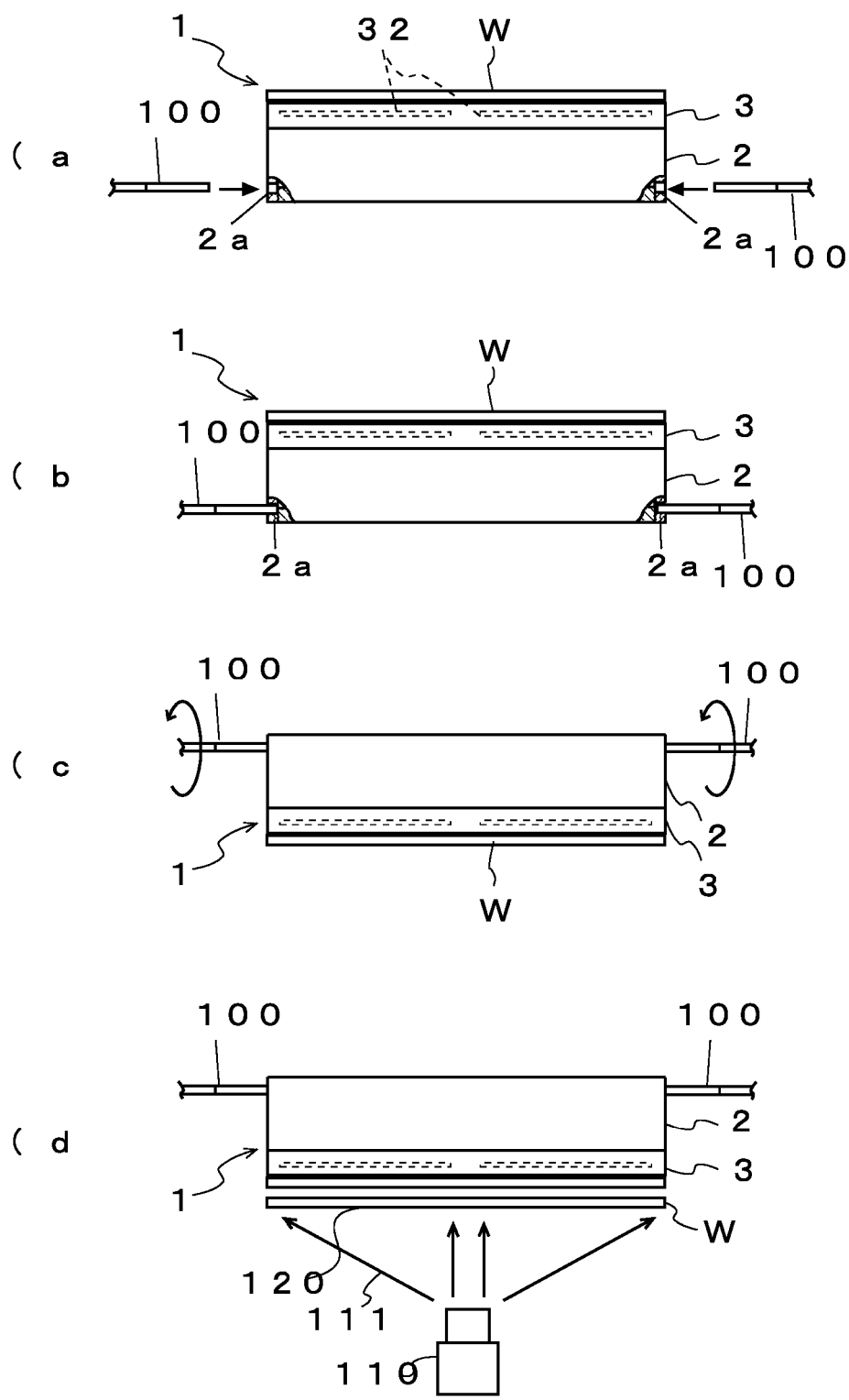

[FIG. 6]
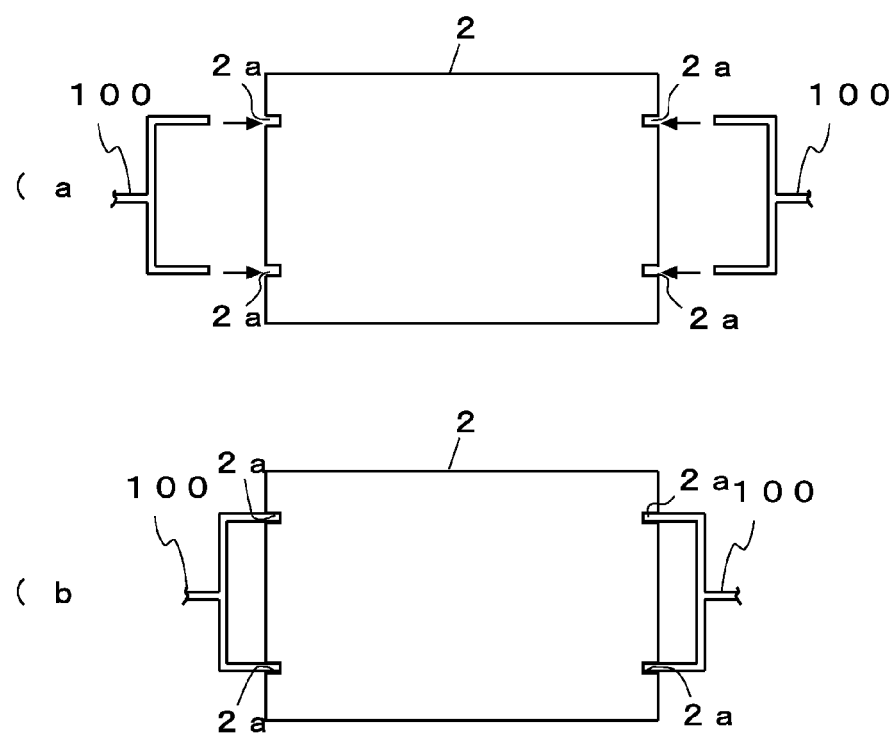

[FIG. 7]
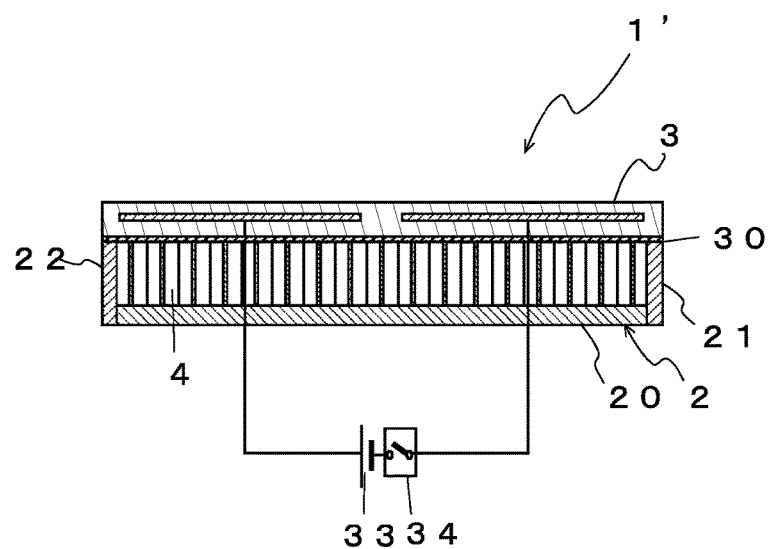

[FIG. 8]
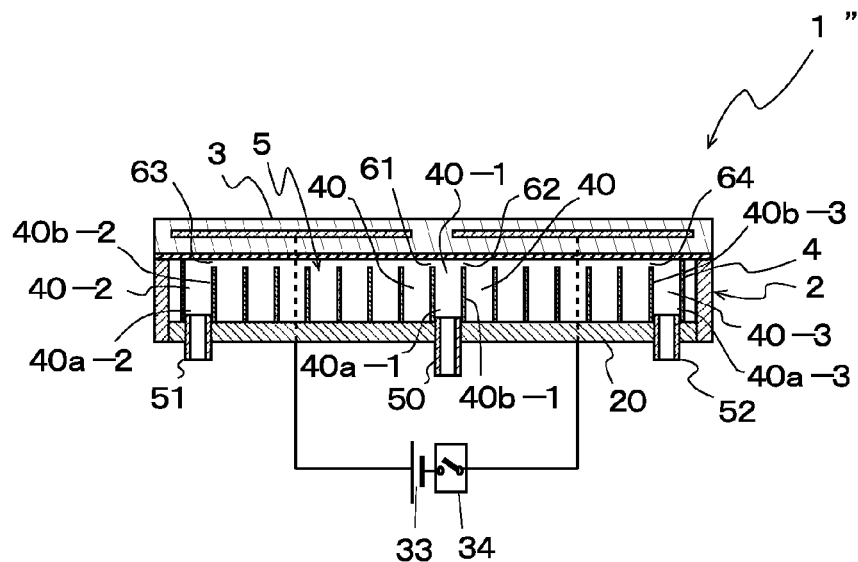
[FIG. 9]
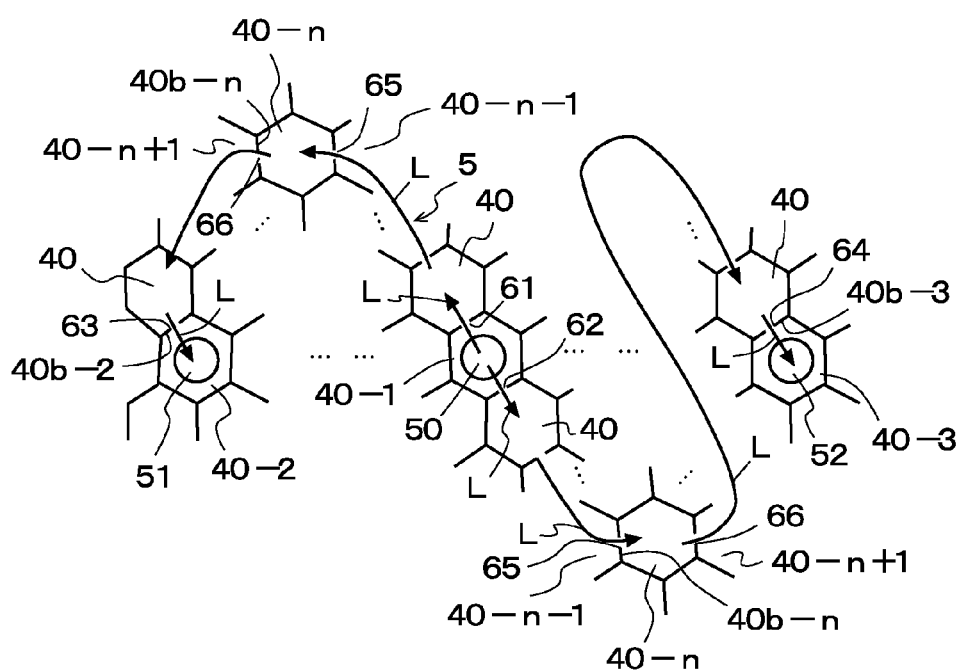

[FIG. 10]
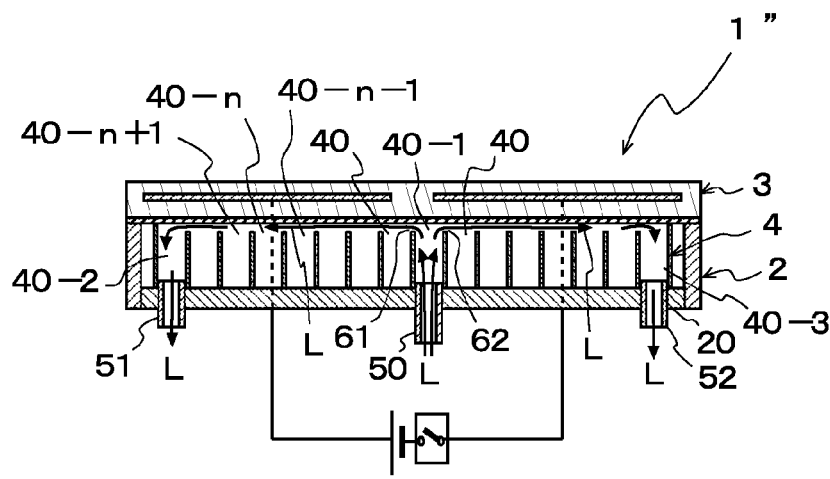
[FIG. 11]
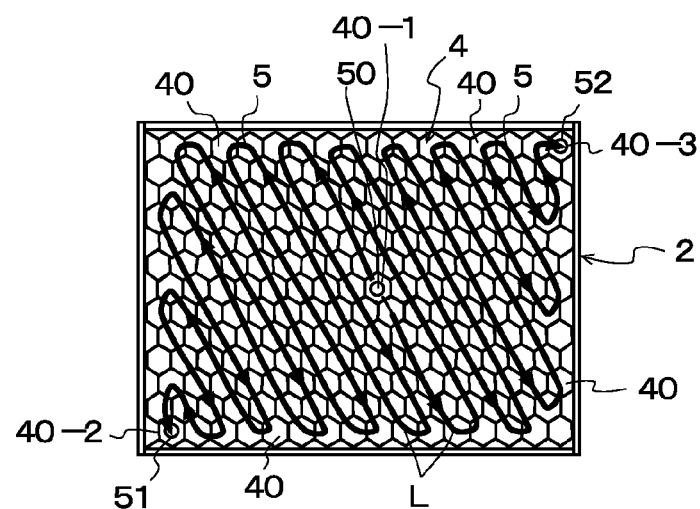

[FIG. 12]
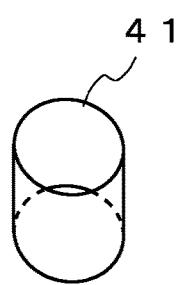
(a)
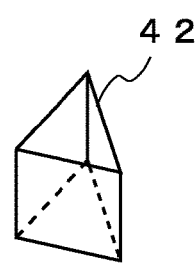
(b)
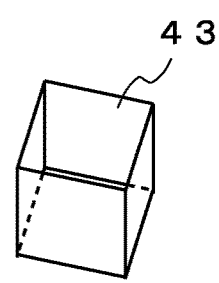
(c)

ELECTROSTATIC CHUCK, GLASS SUBSTRATE PROCESSING METHOD, AND SAID GLASS SUBSTRATE

TECHNICAL FIELD

The present invention relates to an electrostatic chuck for holding a workpiece plate body such as a glass substrate, a glass substrate processing method, and said glass substrate.

BACKGROUND ART

Along with recent upsizing of displays in the field of FPDs (flat panel displays), there has been a need for an apparatus that is capable of conveying and processing, for example, a G8 (8th generation) large-size glass substrate with the dimensions 2200 mm×2500 mm in the process step of processing a display.

A conventional apparatus, for example, for conveying a large-size glass substrate with use of an electrostatic holding technology, e.g. a conventional in-line deposition apparatus for deposition on a surface of a glass substrate, has had a length of several meters to several tens of meters.

As described, for example, in PTL1 and PTL2, such a deposition apparatus is configured to emit a boiled deposition material toward a surface of a large-size glass substrate from a deposition source located below the glass substrate and thereby deposit a desired circuit pattern and the like on the glass substrate surface. For this purpose, an electrostatic holding device holding the glass substrate is rotated as a whole so that the glass substrate faces downward, and the glass substrate is conveyed to a position directly above the deposition source while continuing to face downward. Then, after the deposition process, the glass substrate is released from the holding device and passed on to the next step.

CITATION LIST

Patent Literature

PTL 1: Japanese Patent Application Laid-Open No. 2011-094196 A
PTL 2: Japanese Patent Application Laid-Open No. 2010-132978 A

SUMMARY OF INVENTION

Technical Problem

However, the conventional technology described above has the following problems:

The electrostatic holding device for use in the deposition apparatus is structured such that an electrostatic holding layer formed by thermal spraying or the like is provided on a solid heavy base member made of aluminum or the like. The electrostatic holding device is conveyed while holding a glass substrate on an upper surface of the device. The conveyance is performed by moving shafts supporting the device at both edges of the base member of the device. Then, by rotating the shafts before the device is conveyed to a position directly above the deposition source, the electrostatic holding device and the glass substrate are rotated together so that the glass substrate faces downward, and the glass substrate passes directly above the deposition source while continuing to face downward.

That is, since a process apparatus such as the deposition apparatus needs to be structured to convey and rotate the very heavy electrostatic holding device while supporting it with the shafts, further upsizing of the apparatus as a whole has been inevitable.

Further, when the electrostatic holding device is conveyed or rotated while being supported by the shafts, a very large load is applied to the points at which the base member is supported by the shafts, as the electrostatic holding device is very heavy. This has caused the base member to be distorted to make the electrostatic holding device as a whole poor in flatness, thus making it impossible to convey the glass substrate while keeping the glass substrate at desired flatness.

Furthermore, when, with the electrostatic holding device poor in flatness, the electrostatic holding device and the glass substrate are rotated together so that the glass substrate faces downward, the glass substrate, which is expensive, may fall off the electrostatic holding device. When the glass substrate falls to be broken into pieces, the glass pieces scatter in the form of particles to contaminate the interior of the deposition apparatus to make it unavoidable to stop the apparatus, thus inviting a decrease in productivity. Further, even in a case where the glass substrate does not fall off, there has been a risk that uneven deposition (including uneven film thickness), circuit pattern misregistration, or the like may occur, as deposition is executed on the glass substrate that is inferior in flatness.

The present invention has been made in order to solve the problems mentioned above, and it is an object of the present invention to provide an electrostatic chuck, a glass substrate processing method, and said glass substrate that are intended to prevent falling or the like of a workpiece plate body by reducing the weight of and increasing the strength of a base member and thereby maintaining the flatness of the base member, and to make possible a high-speed and high-quality process on the workpiece plate body.

Solution to Problems

In order to solve the problems described above, an electrostatic chuck according to claim 1 of the present invention includes: an electrostatic holding layer including a dielectric and a holding electrode, the dielectric having a surface serving as a holding surface on which a workpiece plate body is held, the holding electrode being placed within the dielectric; and a base member of which the electrostatic holding layer is placed on the upper surface, the base member including a lower surface plate, a multicellular structure, and side surface plates, the multicellular structure being constituted by a plurality of polygonal tubular bodies or circular tubular bodies tightly arranged in an upright position on the lower surface plate, the side surface plates covering side surfaces of the multicellular structure, respectively.

According to this configuration, when the workpiece plate body, such as a glass substrate, is placed on the surface of the electrostatic holding layer and the holding electrode starts to conduct electricity, an electrostatic force induced on the workpiece plate body and the electrostatic hold layer surface causes the workpiece plate body to be held on the electrostatic holding layer surface.

By supporting the electrostatic chuck with supporting members such as shafts at both edges of the base member in this state, the workpiece plate body can be conveyed together with the electrostatic chuck.

Incidentally, when the base member of the electrostatic chuck is made of solid heavy aluminum, there is a risk that the base member may be distorted by a large load being applied to the edges of the base member at which the electrostatic chuck is being supported by the shafts.

In the present invention, however, the base member includes the lower surface plate, a multicellular structure, and side surface plates, the multicellular structure being constituted by a plurality of polygonal tubular bodies or circular tubular bodies tightly arranged on the lower surface plate, the side surface plates covering sides of the multicellular structure, respectively. As such, the base member has a very light and strong structure. Therefore, the electrostatic chuck per se is light.

For this reason, even in a case where the electrostatic chuck holding the workpiece plate body is conveyed or rotated while being supported by the shafts at both edges of the base member, a load is hardly applied to the edges of the base member at which the electrostatic chuck is being supported by the shafts. Therefore, there is almost no risk that the base member may be distorted.

In claim 1 of the present invention, an electrostatic chuck according to claim 2 of the present invention is configured such that the multicellular structure is a structure constituted by a plurality of triangular tubular bodies, quadrangular tubular bodies, or hexagonal tubular bodies tightly arranged on the lower surface plate without space left between the tubular bodies.

This configuration makes it possible to enhance the strength of the base member while maintaining the light-weight properties of the base member.

In claim 1 or claim 2 of the present invention, an electrostatic chuck according to claim 3 of the present invention is configured such that the electrostatic holding layer is attached directly to an upper surface of the multicellular structure of the base member.

In any one of claim 1 to claim 3 of the present invention, an electrostatic chuck according to claim 4 of the present invention is configured further include a flow channel extending from a fluid supply port to a fluid discharge port, wherein: the fluid supply port is provided in the lower surface plate of the base member and communicates with a lower opening of at least one of the plurality of polygonal tubular bodies or circular tubular bodies; and the fluid discharge port is provided in the lower surface plate but in a different place from the fluid supply port and communicates with a lower opening of at least one of the plurality of polygonal tubular bodies or circular tubular bodies, the flow channel being formed by providing, in a peripheral wall of the polygonal tubular body or circular tubular body whose lower opening communicates with the fluid supply port, a communication hole through which a fluid from the fluid supply port flows out to an adjacent polygonal tubular body or circular tubular body, by providing, in a peripheral wall of the polygonal tubular body or circular tubular body whose lower opening communicates with the fluid discharge port, a communicating hole through which the fluid flows in from an adjacent polygonal tubular body or circular tubular body, and by providing, in a peripheral wall of each of the other polygonal tubular bodies or circular tubular bodies, one communicating hole through which the fluid flows in from an adjacent polygonal tubular body or circular tubular body and another communicating hole through which the fluid flows out to another adjacent polygonal tubular body or circular tubular body.

This configuration allows a fluid for use in cooling supplied from the fluid supply port to flow into the polygonal tubular body or circular tubular body whose lower opening communicates with the fluid supply port. Then, the fluid flows out through the communicating hole provided in the peripheral wall of this polygonal tubular body or circular tubular body to an adjacent polygonal tubular body or circular tubular body. After that, the fluid flows from the adjacent polygonal tubular body or circular tubular body into another polygonal tubular body or circular tubular body through one communicating hole, and flows out to another adjacent polygonal tubular body or circular tubular body through another communicating hole. The fluid repeatedly flows into and out of other polygonal tubular bodies or circular tubular bodies. Finally, the fluid flows into the polygonal tubular body or circular tubular body whose lower opening communicates with the fluid discharge port, and is discharged to the outside through the fluid discharge port.

That is, the electrostatic chuck of the present invention allows the fluid flows through the flow channel extending from the fluid supply port to the fluid discharge port through the plurality of polygonal tubular bodies or circular tubular bodies, thus allowing the electrostatic holding layer on the upper surface of the base member to be cooled by the fluid.

In claim 4 of the present invention, an electrostatic chuck according to claim 5 of the present invention is configured such that the communicating holes are provided in uppermost parts of the peripheral walls of the respective polygonal tubular bodies or circular tubular bodies.

This configuration allows the fluid supplied from the fluid supply port to flow from one polygonal tubular body or circular tubular body to another through the communicating holes. At this time, in the presence of air in a polygonal tubular body or circular tubular body, there is a risk that the fluid may push the air toward an upper part of the polygonal tubular body or circular tubular body and the air may stay there. The air, staying in the upper part of the polygonal tubular body or circular tubular body, is present between the electrostatic holding layer and the fluid, thus reducing the cooling action of the fluid on the electrostatic holding layer.

In the electrostatic chuck of the present invention, however, the communicating holes are provided in uppermost parts of the peripheral walls of the respective polygonal tubular bodies or circular tubular bodies. Therefore, the air staying in the upper part of the polygonal tubular body or circular tubular body is pushed away together with the fluid toward the fluid discharge port through the communicating holes. This prevents the air from staying in the upper part of the polygonal tubular body or circular tubular body, thus making it possible to effectively cool the electrostatic holding layer.

A glass substrate processing method according to claim 6 of the present invention includes: a first step of holding a glass substrate on a surface of an electrostatic chuck according to any one of claim 1 to claim 52; a second step of supporting the electrostatic chuck at both side edges of the base member, with the electrostatic chuck holding the glass substrate; a third step of, while supporting the electrostatic chuck, rotating the entire electrostatic chuck downward so that the glass substrate faces downward; and a fourth step of processing a surface of the glass substrate from a lower position than the glass substrate.

According to this configuration, executing the first step causes the glass substrate to be held on the surface of the electrostatic chuck, and after that, executing the second step causes the electrostatic chuck to be supported at both side edges of the base member, with the electrostatic chuck holding the glass substrate.

When the electrostatic chuck is thus supported at both edges of the base member, there is a risk that the base member may be distorted by a large load being applied to the edges of the base member at which the electrostatic chuck is being supported. In the present invention, however, since an electrostatic chuck according to any one of claim 1 to claim 3 of the present invention is used as the electrostatic chuck for holding the glass substrate, the electrostatic chuck per se is very light. For this reason, even when the electrostatic chuck is for example conveyed while being supported by shafts at both edges of the base member, a load is hardly applied, so that there is no risk that the base member may be distorted.

Then, executing the third step causes the entire electrostatic chuck to be rotated downward so that the glass substrate faces downward, while the electrostatic chuck is being supported.

Since, at this time, the base member is not distorted and the electrostatic chuck has its flatness maintained at a desired value, the glass substrate does not fall off the electrostatic chuck during rotation. As a result of this, the glass substrate, too, faces downward while keeping the desired flatness.

Executing the fourth step with the glass substrate facing downward causes a surface of the glass substrate to be processed from a lower position than the glass substrate.

Since, at this time, the glass substrate is keeping the desired flatness, a process such as deposition can be accurately performed on the glass substrate without the occurrence of uneven deposition (including uneven film thickness), circuit pattern misregistration, or the like.

A glass substrate according to claim 7 of the present invention is a glass substrate processed by the glass substrate processing method according to claim 6 of the present invention.

Advantageous Effects of Invention

As described above in detail, the electrostatic chuck according to claim 1 of the present invention is configured such that the base member is lighter in weight and higher in strength. Therefore the base member of the electrostatic chuck is hardly distorted even when the electrostatic chuck is conveyed and rotated while holding the workpiece plate body and being supported by the shafts. This in turn brings about an advantageous effect of keeping the flatness of the base member at the desired value.

This also makes it possible to reduce the size of and simplify the structure of an apparatus such as a deposition apparatus as a whole.

Moreover, since the workpiece plate body can be prevented from falling off during rotation of the electrostatic chuck, contamination in the apparatus, stoppage of the apparatus, and the like due to breakage of the workpiece plate body can be prevented.

Further, since the flatness of the base member is kept at the desired value and flatness of the workpiece plate body is maintained, uneven deposition (including uneven film thickness), circuit pattern misregistration, or the like in a process such as deposition can be prevented.

Furthermore, the reduction in the weight of the electrostatic chuck 1 per se increases the speed of movement, such as conveyance and rotation, of the workpiece plate body. This in turn brings about an effect of shortening takt time and improving productivity.

Further, the electrostatic chuck according to claim 2 of the present invention is configured such that the multicellular structure is a structure constituted by a plurality of triangular tubular bodies, quadrangular tubular bodies, or hexagonal tubular bodies tightly arranged on the lower surface plate without space left between the tubular bodies. This configuration brings about an effect of enhancing the strength of the base member while maintaining the lightweight properties of the base member.

Further, the electrostatic chuck according to claim 3 of the present invention achieves a further reduction in the weight of the electrostatic chuck.

Furthermore, the electrostatic chuck according to claim 4 or claim 5 of the present invention allows the electrostatic holding layer having been heated to be effectively cooled by the fluid flowing through the polygonal tubular bodies or circular tubular bodies.

Further, the glass substrate processing method according to claim 6 of the present invention makes it possible to process a glass substrate while keeping the glass substrate at desired flatness, thus bringing about an effect of performing a process such as deposition at a high speed and with accuracy.

Furthermore, the use of the lightweight electrostatic chuck increases the speed of movement, such as conveyance and rotation, of the glass substrate, thus bringing about an effect of shortening takt time and improving productivity.

Furthermore, the glass substrate according to claim 7 of the present invention is processed by the glass substrate processing method according to claim 6 of the present invention, thus brining about an effect of providing a high-quality glass substrate free of uneven deposition (including uneven film thickness), circuit pattern misregistration, or the like.

BRIEF DESCRIPTION OF DRAWINGS

FIG. 1 is an exploded perspective view showing an electrostatic chuck according to a first embodiment of the present invention.

FIG. 2 is a cross-sectional view of the electrostatic chuck.

FIG. 3 is an exploded perspective view showing a base member.

FIG. 4 is a perspective view showing a regular hexagonal tubular body.

FIG. 5 is a process chart showing the processing of a glass substrate with use of the electrostatic chuck.

FIG. 6 is a schematic plan view showing a process of supporting the base member with shafts.

FIG. 7 is a cross-sectional view showing an electrostatic chuck according to a second embodiment of the present invention.

FIG. 8 is a cross-sectional view showing an electrostatic chuck according to a third embodiment of the present invention.

FIG. 9 is a schematic plan view for explaining a communicating hole in each regular hexagonal tubular body.

FIG. 10 is a cross-sectional view showing the flow of a fluid.

FIG. 11 is a schematic plan view showing the flow of the fluid.

FIG. 12 is a perspective view showing modifications of tubular bodies.

DESCRIPTION OF EMBODIMENTS

Best modes of the present invention are described below with reference to the drawings.

First Embodiment

FIG. 1 is an exploded perspective view showing an electrostatic chuck according to a first embodiment of the present invention. FIG. 2 is a cross-sectional view of the electrostatic chuck.

As shown in FIGS. 1 and 2, an electrostatic chuck 1 of the present embodiment includes a base member 2 and an electrostatic holding layer 3.

FIG. 3 is an exploded perspective view showing the base member 2. FIG. 4 is a perspective view showing a regular hexagonal tubular body.

As shown in FIG. 3, the base member 2 is a box object formed by a lower surface plate 20, side surface plates 21 to 24, and an upper surface plate 25. The base member 2 has a multicellular structure 4 inside it. The multicellular structure 4 is constituted by regular hexagonal tubular bodies 40.

As shown in FIG. 4, each of the regular hexagonal tubular bodies 40 is a regular hexagonal tubular body having openings at both the upper and lower ends thereof.

As shown in FIG. 3, the multicellular structure 4 is a honeycomb structure constituted by such regular hexagonal tubular bodies 40 tightly arranged in an upright position on the lower surface plate 20 without space left between the regular hexagonal tubular bodies 40.

The four side surface plates 21 to 24 hermetically cover side surfaces of the multicellular structure 4, i.e. the honeycomb structure. The single upper surface plate 25 hermetically covers an upper surface of the multicellular structure 4.

In the present embodiment, the multicellular structure 4, the lower surface plate 20, on which the multicellular structure 4 is mounted, the side surface plates 21 to 24, and the upper surface plate 25 are made of aluminum subjected to $Al_2O_3$ anodic oxide coating (alumite treatment).

However, the base member 2 may of course be made of a material other than aluminum, such as SUS, iron, copper, titanium, a ceramic (including ALN, SiC, $Al_2O_3$, SiN, zirconium, BN, TiC, and TiN), or the like.

In the present embodiment, coating with an insulator film is done by alumite treatment. However, for example, the entire base member 2 may be filmed by thermal spraying of a ceramic such as $Al_2O_3$, and insulation may be achieved by another insulator film.

In FIG. 1, the electrostatic holding layer 3 is a component configured to hold a large-size glass substrate W that is a workpiece plate body. As shown in FIG. 2, the electrostatic holding layer 3 is bonded to an upper surface of the base member 2 with an adhesive 30.

Specifically, the electrostatic holding layer 3 is completely bonded to the upper surface of the base member 2 by applying the adhesive 30 to either the upper surface plate (and the side surface plates 21 to 24) of the base member 2 or a lower surface of the electrostatic holding layer 3 and then curing the adhesive 30 through the application of heat.

The adhesive 30 used in the present embodiment is a thermosetting adhesive. Alternatively, the electrostatic holding layer 3 can also be bonded to the base member 2 by using an ultraviolet curable adhesive as the adhesive 30.

As shown in FIG. 1, the electrostatic holding layer 3 includes a dielectric 31 and a holding electrode 32.

The dielectric 31 is a dielectric having a surface serving as a holding surface on which the glass substrate W is held, and contains the holding electrode 32.

As shown in FIG. 2, the holding electrode 32, placed within the dielectric 31, is connected to a direct-current power supply 33, and is configured to conduct electricity when a switch 34 is turned on.

In the present embodiment, the dielectric 31 is formed by a polyimide film such as Kapton (registered trademark). Further, the holding electrode 32 is made of carbon ink, Cu, or the like. Instead of being made of any of these materials, however, the holding electrode 32 may be made of a conductive substance (in foil or paste form) composed mostly of or mixed with SUS, iron, nickel, silver, platinum, or the like.

Alternatively, it is possible to use a ceramic as a dielectric and, by using a metal plate with the ceramic film, constitute the electrostatic holding layer 3 including the dielectric 31 and the holding electrode 32.

Furthermore, as shown in FIGS. 1 and 2, the present embodiment shows a electrode of coulomb force-type as an example of the holding electrode 32. However, the holding electrode 32 may be a comb-like electrode of gradient force-type to have a higher holding force with respect to a nonconductor such as glass.

Next, an example of use of the electrostatic chuck of the present embodiment is described below.

It should be noted that this example of use is one in which a glass substrate processing method of the present invention is specifically executed.

FIG. 5 is a process chart showing the processing of a glass substrate with use of the electrostatic chuck. FIG. 6 is a schematic plan view showing a process of supporting the base member with shafts.

First, when the glass substrate W is placed on a surface of the electrostatic holding layer 3 as shown in (a) of FIG. 5 and the switch 34 shown in FIG. 2 is turned on, the direct-current power supply 33 applies a voltage to the holding electrode 32, so that the holding electrode 32 starts to conduct electricity. This induces an electrostatic force on the glass substrate W and the electrostatic hold layer 3. The electrostatic force thus induced causes the glass substrate W to be held on the surface of the electrostatic holding layer 3 (execution of a first step).

(a) of FIG. 5 and (a) of FIG. 6 show bifurcated shafts 100 of a deposition apparatus (not illustrated). The shafts 100 have their leading ends configured to be inserted into holes 2a provided at both edges of the base member 2.

With the glass substrate W held on the surface of the electrostatic holding layer 3, as shown in (b) of FIG. 5 and (b) of FIG. 6, the glass substrate W can be conveyed together with the electrostatic chuck 1 by inserting the shafts 100 into the holes 2a at both edges of the base member 2 and supporting the electrostatic chuck 1 with the shafts 100 (execution of a second step).

When the electrostatic chuck 1 is thus supported by the shafts 100 at both edges of the base member 2, there is a risk that the base member 2 may be distorted by a large load being applied to the edges of the base member 2 at which the electrostatic chuck 1 is being supported by the shafts 100.

In the electrostatic chuck 1 of the present embodiment, however, the base member 2 has its inner part constituted by the multicellular structure 4 and, what is more, the multicellular structure 4 is a honeycomb structure constituted by the regular hexagonal tubular bodies 40 tightly arranged in an upright position on the lower surface plate 20 without space left between the regular hexagonal tubular bodies 40, and is therefore very light in weight and also high in strength against transverse pressure and longitudinal pressure.

For this reason, even when the base member 2 is supported by the shafts 100 at both edges, a load is hardly applied to the base member 2 and the base member 2 is therefore not distorted.

Then, as shown in (c) of FIG. 5, the shafts 100 are rotated while supporting the electrostatic chuck 1. This causes the electrostatic chuck 1 as a whole to face downward so that the glass substrate W is located on the lower side (execution of a third step).

Since, at this time, the base member 2 is not distorted and the electrostatic chuck 1 has its flatness maintained at a desired value as described above, the glass substrate W is being firmly held on the electrostatic holding layer 3. For this reason, the glass substrate does not fall off the electrostatic chuck 1. That is, the glass substrate is facing downward while keeping the desired flatness.

While the glass substrate W is facing downward, as shown in (d) of FIG. 5, a deposition process is performed on the glass substrate W by allowing the electrostatic chuck 1 to pass directly above a deposition source 110 while being supported by the shafts 100 (execution of a fourth step).

Specifically, with a mask 120 formed into a circuit pattern or the like and placed directly below the glass substrate W, a deposition material 111 is sprayed from the deposition source 110 toward the glass substrate W being held by the electrostatic chuck 1.

Since, at this time, the glass substrate W is keeping the desired flatness, the deposition process can be accurately performed on the glass substrate W without the occurrence of uneven deposition (including uneven film thickness), circuit pattern misregistration, or the like.

In the electrostatic chuck 1 of the present embodiment, as described above, the base member 2 has a lightweight and robust structure. Therefore, the base member 2 is not distorted by a load applied to the base member 2, and has its flatness maintained at a desired value. This in turn makes it possible to prevent breakage of the glass substrate W, contamination of the ambient environment, and the like, and to reduce the size of and simplify the structure of an apparatus such as a deposition apparatus as a whole.

Furthermore, the reduction in the weight of the electrostatic chuck 1 per se increases the speed of movement, such as conveyance and rotation, of the glass substrate W. This in turn shortens takt time and improves productivity.

Second Embodiment

Next, a second embodiment of the present invention is described below.

FIG. 7 is a cross-sectional view showing an electrostatic chuck according to a second embodiment of the present invention.

In an electrostatic chuck 1' of the present embodiment, as shown in FIG. 7, the base member 2 is constituted by the lower surface plate 20, the side surface plates 21 to 24, and the multicellular structure 4, with the omission of the upper surface plate 25.

The electrostatic holding layer 3, which is made of a ceramic, is attached directly to an upper surface of the multicellular structure 4 of the base member 2, which has no upper surface plate 25, with the adhesive 30.

The omission of the upper surface plate 25 as a component of the base member 2 reduces the number of members, thus further reducing the weight and cost of the electrostatic chuck.

The other components, functions, and effects are the same as those of the first embodiment, and as such, are not described here.

Third Embodiment

Next, a third embodiment of the present invention is described below.

FIG. 8 is a cross-sectional view showing an electrostatic chuck according to a third embodiment of the present invention. FIG. 9 is a schematic plan view for explaining a communicating hole in each regular hexagonal tubular body.

As shown in FIG. 8, an electrostatic chuck 1" of the present embodiment includes a flow channel 5 formed inside the multicellular structure 4.

The flow channel 5 is a flow channel through which a fluid for use in cooling flows. The flow channel 5 extends from a fluid supply port 50 to fluid discharge ports 51 and 52 through the multicellular structure 4.

Specifically, the fluid supply port 50 is provided in a central part of the lower surface plate 20 of the base member 2, and communicates with a lower opening 40a-1 of a regular hexagonal tubular body 40-1 located in the center.

Moreover, the fluid discharge ports 51 and 52 are provided in both corners of the lower surface plate 20, and communicate with lower openings 40a-2 and 40a-3 of regular hexagonal tubular body 40-2 and 40-3 located in both corners, respectively.

The regular hexagonal tubular body 40-1, which communicates with the fluid supply port 50, has a pair of communicating holes 61 and 62.

As shown in FIG. 9, the communicating holes 61 and 62 are provided in the uppermost part of a peripheral wall 40b-1 of the regular hexagonal tubular body 40-1, and allow a fluid L from the fluid supply port 50 to flow out to adjacent regular hexagonal tubular bodies 40 through the communicating holes 61 and 62, respectively.

The regular hexagonal tubular body 40-2 (40-3), which communicates with the fluid discharge port 51 (51), has a single communicating hole 63 (64).

The communicating hole 63 (64) is provided in the uppermost part of a peripheral wall 40b-2 (40b-3) of the regular hexagonal tubular body 40-2 (40-3), and allows a fluid L from an adjacent regular hexagonal tubular body 40 to flow into the regular hexagonal tubular body 40-2 (40-3) through the communicating hole 63 (64).

Each of the regular hexagonal tubular bodies 40-$n$ other than the regular hexagonal tubular bodies 40-1 to 40-3 has a pair of communicating holes 65 and 66.

The communicating holes 65 and 66 are provided in the uppermost part of a peripheral wall 40b-$n$ of each of the regular hexagonal tubular bodies 40-$n$. The communicating hole 65 is a communicating hole through which a fluid L from an adjacent regular hexagonal tubular body 40-$n$−1 flows in. The communicating hole 66 is a communicating hole through which the fluid L flows out to an adjacent regular hexagonal tubular body 40-$n$+1. It should be noted that in FIG. 9, each of the regular hexagonal tubular bodies 40 adjacent to the regular hexagonal tubular bodies 40-1 to 40-3 shall be deemed to be a given regular hexagonal tubular body 40-$n$.

Next, the functions and effects of the electrostatic chuck F' of the present embodiments are described below.

FIG. 10 is a cross-sectional view showing the flow of a fluid L. FIG. 11 is a schematic plan view showing the flow of the fluid L.

As indicated by arrows in FIG. 10, the fluid L, such as cooling water or coolant gas, when supplied from the fluid supply port 50 to the regular hexagonal tubular body 40-1 of the multicellular structure 4, flows out to the adjacent regular hexagonal tubular bodies 40 through the communicating holes 61 and 62 of the regular hexagonal tubular body 40-1, respectively.

After that, the fluid L reaches the fluid discharge port 51 (52) through the communicating holes in a large number of regular hexagonal tubular bodies 40. That is, the fluid L flows from an adjacent regular hexagonal tubular body 40-*n*−1 through the communicating hole 65 into a given regular hexagonal tubular body 40-*n* and flows out to an adjacent regular hexagonal tubular body 40-*n*+1 through the communicating hole 66. Then, finally, the fluid L reaches the regular hexagonal tubular body 40-2 (40-3), and is discharged out of the base member 2 through the fluid discharge port 51 (52).

That is, as shown in FIG. 11, the fluid L reaches the fluid discharge port 51 (52) through almost all of the regular hexagonal tubular bodies 40 from the fluid supply port 50, thus effectively cooling the electrostatic holding layer 3 (see FIG. 10) placed over the top of the lower surface plate 20.

Incidentally, in the presence of air in a regular hexagonal tubular body 40, the fluid L pushes the air toward an upper part of the regular hexagonal tubular body 40 and the air stays there. This causes the air to be present between the electrostatic holding layer 3 and the fluid L, thus posing a risk of reducing the cooling action on the electrostatic holding layer 3.

To avoid the risk, the present embodiment, as shown in FIG. 8, provides the communicating holes 61 to 66 in the uppermost parts of the peripheral walls of the respective regular hexagonal tubular bodies 40 so that the air can be pushed away toward the fluid discharge port 51 (52) through the communicating holes 61 to 66.

Therefore, in a case where air does not stay in the upper part of a regular hexagonal tubular body 40 or in a case where air stays in the upper part of a regular hexagonal tubular body 40 but does not affect the cooling of the electrostatic holding layer 3, the communicating holes 61 to 66 do not need to be provided in the uppermost parts of the peripheral walls of the regular hexagonal tubular bodies 40. In this case, for example, the communicating holes 61 to 66 may of course be provided in the central parts or lowermost parts of the peripheral walls.

The other components, functions, and effects are the same as those of the first and second embodiments, and as such, are not described here.

The present invention is not limited to the embodiments described above, but may be altered or modified in various ways within the scope of the gist of the present invention.

For example, while, in each of the embodiments described above, the multicellular structure 4 is a honeycomb structure, a multicellular structure needs only be constituted by a plurality of polygonal tubular bodies or circular tubular bodies tightly arranged on the lower surface plate 20 of the base member 2, and is not limited to a honeycomb structure. Therefore, a multicellular structure constituted by a plurality of non-hexagonal polygonal tubular bodies or circular tubular bodies 41 (see (a) of FIG. 12) tightly arranged in a honeycomb manner is also encompassed in the scope of the present invention.

However, it is preferable that a multicellular structure be such a structure as to be robust over transverse pressure and longitudinal pressure and be able to contribute to a reduction in weight.

From this standpoint, a tight arrangement of tubular bodies other than triangular, quadrangular, or hexagonal tubular bodies in a honeycomb manner has space left between adjacent tubular bodies, and as such, is inferior in strength to the multicellular structure 4 of the present invention, which is a honeycomb structure. Therefore, it is most preferable, in terms of strength, that a multicellular structure be constituted by a plurality of regular triangular tubular bodies 42 (see (b) of FIG. 12), regular quadrangular tubular bodies 43 (see (c) of FIG. 12), or regular hexagonal tubular bodies 40 (see each of the embodiments described above) tightly arranged without space left between the tubular bodies.

While the third embodiment has been described above by taking, as example, a case where one or two communicating holes is/are provided in the peripheral wall of each regular hexagonal tubular body 40, any number of communicating holes may be provided. That is, since the number of regular hexagonal tubular bodies 40 adjacent to a single regular hexagonal tubular body 40 is six, three or more communicating holes may be provided in the single regular hexagonal tubular body 40 so that the single regular hexagonal tubular body 40 can communicate with three or more of the six adjacent regular hexagonal tubular bodies 40.

REFERENCE SIGNS LIST

1, 1', 1" . . . electrostatic chuck,
2 . . . base member,
3 . . . electrostatic holding layer,
4 . . . multicellular structure,
5 . . . flow channel,
20 . . . lower surface plate,
21 to 24 . . . side surface plate,
25 . . . upper surface plate,
30 . . . adhesive,
31 . . . dielectric,
32 . . . holding electrode,
33 . . . direct-current power supply,
34 . . . switch,
40, 40-1 to 40-*n*+1 . . . regular hexagonal tubular body,
40*a*-1 to 40*a*-3 . . . lower opening,
40*b*-1 to 40*b*-*n* . . . peripheral wall,
41 . . . circular tubular body,
42 . . . regular triangular tubular body,
43 . . . regular quadrangular tubular body,
50 . . . fluid supply port,
51, 52 . . . fluid discharge port,
61 to 66 . . . communicating hole,
100 . . . shaft,
110 . . . deposition source,
111 . . . deposition material,
120 . . . mask,
L . . . fluid,
W . . . glass substrate.

The invention claimed is:

1. An electrostatic chuck comprising:
    an electrostatic holding layer including a dielectric and a holding electrode, the dielectric having a surface serving as a holding surface on which a workpiece plate body is held, the holding electrode being placed within the dielectric; and
    a base member of which the electrostatic holding layer is placed on an upper surface,
    the base member including a lower surface plate, a multicellular structure, and side surface plates, the multicellular structure being constituted by a plurality of polygonal tubular bodies or circular tubular bodies tightly arranged in an upright position on the lower surface plate, the side surface plates covering side surfaces of the multicellular structure, respectively.

2. The electrostatic chuck according to claim 1, wherein the multicellular structure is a structure constituted by a plurality of triangular tubular bodies, quadrangular tubular bodies, or hexagonal tubular bodies tightly arranged on the lower surface plate without space left between the tubular bodies.

3. The electrostatic chuck according to claim 1, wherein the electrostatic holding layer is attached directly to an upper surface of the multicellular structure of the base member.

4. The electrostatic chuck according to claim 1, comprising a flow channel extending from a fluid supply port to a fluid discharge port, wherein:
the fluid supply port is provided in the lower surface plate of the base member and communicates with a lower opening of at least one of the plurality of polygonal tubular bodies or circular tubular bodies; and
the fluid discharge port is provided in the lower surface plate but in a different place from the fluid supply port and communicates with a lower opening of at least one of the plurality of polygonal tubular bodies or circular tubular bodies,
the flow channel being formed by providing, in a peripheral wall of the polygonal tubular body or circular tubular body whose lower opening communicates with the fluid supply port, a communication hole through which a fluid from the fluid supply port flows out to an adjacent polygonal tubular body or circular tubular body, by providing, in a peripheral wall of the polygonal tubular body or circular tubular body whose lower opening communicates with the fluid discharge port, a communicating hole through which the fluid flows in from an adjacent polygonal tubular body or circular tubular body, and by providing, in a peripheral wall of each of the other polygonal tubular bodies or circular tubular bodies, one communicating hole through which the fluid flows in from an adjacent polygonal tubular body or circular tubular body and another communicating hole through which the fluid flows out to another adjacent polygonal tubular body or circular tubular body.

5. The electrostatic chuck according to claim 4, wherein the communicating holes are provided in uppermost parts of the peripheral walls of the respective polygonal tubular bodies or circular tubular bodies.

6. A glass substrate processing method, comprising:
a first step of holding a glass substrate on a surface of an electrostatic chuck according to claim 1;
a second step of supporting the electrostatic chuck at both side edges of the base member, with the electrostatic chuck holding the glass substrate;
a third step of, while supporting the electrostatic chuck, rotating the entire electrostatic chuck downward so that the glass substrate faces downward; and
a fourth step of processing a surface of the glass substrate from a lower position than the glass substrate.

7. A glass substrate processed by a glass substrate processing method according to claim 6.

8. The electrostatic chuck according to claim 2, wherein the electrostatic holding layer is attached directly to an upper surface of the multicellular structure of the base member.

9. The electrostatic chuck according to claim 2, comprising a flow channel extending from a fluid supply port to a fluid discharge port, wherein:
the fluid supply port is provided in the lower surface plate of the base member and communicates with a lower opening of at least one of the plurality of polygonal tubular bodies or circular tubular bodies; and
the fluid discharge port is provided in the lower surface plate but in a different place from the fluid supply port and communicates with a lower opening of at least one of the plurality of polygonal tubular bodies or circular tubular bodies,
the flow channel being formed by providing, in a peripheral wall of the polygonal tubular body or circular tubular body whose lower opening communicates with the fluid supply port, a communication hole through which a fluid from the fluid supply port flows out to an adjacent polygonal tubular body or circular tubular body, by providing, in a peripheral wall of the polygonal tubular body or circular tubular body whose lower opening communicates with the fluid discharge port, a communicating hole through which the fluid flows in from an adjacent polygonal tubular body or circular tubular body, and by providing, in a peripheral wall of each of the other polygonal tubular bodies or circular tubular bodies, one communicating hole through which the fluid flows in from an adjacent polygonal tubular body or circular tubular body and another communicating hole through which the fluid flows out to another adjacent polygonal tubular body or circular tubular body.

10. The electrostatic chuck according to claim 3, comprising a flow channel extending from a fluid supply port to a fluid discharge port, wherein:
the fluid supply port is provided in the lower surface plate of the base member and communicates with a lower opening of at least one of the plurality of polygonal tubular bodies or circular tubular bodies; and
the fluid discharge port is provided in the lower surface plate but in a different place from the fluid supply port and communicates with a lower opening of at least one of the plurality of polygonal tubular bodies or circular tubular bodies,
the flow channel being formed by providing, in a peripheral wall of the polygonal tubular body or circular tubular body whose lower opening communicates with the fluid supply port, a communication hole through which a fluid from the fluid supply port flows out to an adjacent polygonal tubular body or circular tubular body, by providing, in a peripheral wall of the polygonal tubular body or circular tubular body whose lower opening communicates with the fluid discharge port, a communicating hole through which the fluid flows in from an adjacent polygonal tubular body or circular tubular body, and by providing, in a peripheral wall of each of the other polygonal tubular bodies or circular tubular bodies, one communicating hole through which the fluid flows in from an adjacent polygonal tubular body or circular tubular body and another communicating hole through which the fluid flows out to another adjacent polygonal tubular body or circular tubular body.

11. A glass substrate processing method, comprising:
a first step of holding a glass substrate on a surface of an electrostatic chuck according to claim 2;
a second step of supporting the electrostatic chuck at both side edges of the base member, with the electrostatic chuck holding the glass substrate;
a third step of, while supporting the electrostatic chuck, rotating the entire electrostatic chuck downward so that the glass substrate faces downward; and
a fourth step of processing a surface of the glass substrate from a lower position than the glass substrate.

12. A glass substrate processing method, comprising:
a first step of holding a glass substrate on a surface of an electrostatic chuck according to claim 3;
a second step of supporting the electrostatic chuck at both side edges of the base member, with the electrostatic chuck holding the glass substrate;

a third step of, while supporting the electrostatic chuck, rotating the entire electrostatic chuck downward so that the glass substrate faces downward; and a fourth step of processing a surface of the glass substrate from a lower position than the glass substrate.

13. A glass substrate processing method, comprising:

a first step of holding a glass substrate on a surface of an electrostatic chuck according to claim 4;

a second step of supporting the electrostatic chuck at both side edges of the base member, with the electrostatic chuck holding the glass substrate;

a third step of, while supporting the electrostatic chuck, rotating the entire electrostatic chuck downward so that the glass substrate faces downward; and a fourth step of processing a surface of the glass substrate from a lower position than the glass substrate.

14. A glass substrate processing method, comprising:

a first step of holding a glass substrate on a surface of an electrostatic chuck according to claim 5;

a second step of supporting the electrostatic chuck at both side edges of the base member, with the electrostatic chuck holding the glass substrate;

a third step of, while supporting the electrostatic chuck, rotating the entire electrostatic chuck downward so that the glass substrate faces downward; and a fourth step of processing a surface of the glass substrate from a lower position than the glass substrate.

* * * * *